United States Patent
Le et al.

(10) Patent No.: US 6,292,406 B1
(45) Date of Patent: Sep. 18, 2001

(54) METHOD AND LOW-POWER CIRCUITS USED TO GENERATE ACCURATE BOOSTED WORDLINE VOLTAGE FOR FLASH MEMORY CORE CELLS IN READ MODE

(75) Inventors: Binh Q. Le, San Jose; Pau-Ling Chen, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/609,678

(22) Filed: Jul. 3, 2000

(51) Int. Cl.[7] ................................................. G11C 7/00
(52) U.S. Cl. ............................. 365/189.09; 365/230.06
(58) Field of Search ........................... 365/189.09, 226, 365/230.06, 185.18, 185.2, 185.23

(56) References Cited

U.S. PATENT DOCUMENTS 5,255,224 * 10/1993 Galbi et al. ........................... 365/226
5,398,207 * 3/1995 Tsuchida et al. ...................... 365/226
6,128,242 * 10/2000 Banba et al. .......................... 365/226
6,137,732 * 10/2000 Inaba .................................. 365/230.06

* cited by examiner

*Primary Examiner*—Trong Phan
(74) *Attorney, Agent, or Firm*—Davis Chin

(57) ABSTRACT

Control circuitry and a method for generating an accurate boosted wordline voltage for selected memory core cells in a semiconductor memory device during a Read mode of operation is provided. Memory core transistors are provided which have their conduction path being coupled between a power supply voltage and a ground potential. Differential amplifier circuitry is responsive to a boost signal and a reference voltage for generating a select wordline voltage. The select wordline voltage is decreased when the wordline voltage is higher than a desired voltage and is increased when the wordline voltage is lower than the desired voltage. The control gates of the memory core transistors are responsive to the select wordline voltage.

10 Claims, 5 Drawing Sheets

METHOD AND LOW-POWER CIRCUITS USED TO GENERATE ACCURATE BOOSTED WORDLINE VOLTAGE FOR FLASH MEMORY CORE CELLS IN READ MODE

BACKGROUND OF THE INVENTION

This invention relates generally to floating gate memory devices such as an array of Flash electrically, erasable programmable read-only memory (EEPROM) cells. More particularly, the present invention relates to a control circuit for generating an accurate boosted wordline voltage for memory core cells during a Read mode of operation.

As is generally known in the art, there exists a class of non-volatile memory devices referred to as "Flash EEPROMs" which has recently emerged as an important memory device by combining the advantages of EPROM density with EEPROM electrical erasability. Such Flash EEPROMs provide electrical erasing and a small cell size. In a conventional Flash EEPROM memory device, a plurality of one-transistor core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

One type of architecture used for Flash memories is typically referred to as a NOR Flash memory architecture which is an array of Flash EEPROM cells (floating gate devices) which are divided into a plurality of sectors. Further, the memory cells within each sector are arranged in rows of wordlines and columns of bitlines intersecting the rows of wordlines. The source region of each cell transistor within each sector is tied to a common node. Therefore, all of the cells within a particular sector can be erased simultaneously and erasure may be performed on a sector-by-sector basis. The control gates of the cell transistors are coupled to wordlines, and the drains thereof are coupled to bit lines.

In order to program the Flash EEPROM cell in conventional operation, the drain region and the control gate are raised to predetermined potentials above the potential applied to the source region. For example, the drain region has applied thereto a voltage $V_D$ of approximately +5.5 volts with the control gate $V_G$ having a voltage of approximately +9 volts applied thereto. These voltages produce "hot electrons" which are accelerated across the thin dielectric layer and onto the floating gate. This hot electron injection results in an increase of the floating gate threshold by approximately two to four volts.

For erasing the Flash EEPROM cell in conventional operation, a positive potential (e.g., +5 volts) is applied to the source region. The control gate is applied with a negative potential (e.g., −8 volts), and the drain region is allowed to float. A strong electric field develops between the floating gate and the source region, and a negative charge is extracted from the floating gate to the source region by way of Fowler-Nordheim tunneling.

In order to determine whether the Flash EEPROM cell has been properly programmed or not, the magnitude of the read current is measured. Typically, in the read mode of operation the source region is held at a ground potential (0 volts) and the control gate is held at a potential of about +5 volts. The drain region is held at a potential between +1 to +2 volts. Under these conditions, an unprogrammed cell (storing a logic "1") will conduct a current level approximately 50 to 100 $\mu$A. The programmed cell (storing a logic "0") will have considerably less current flowing.

Figures 1, 1A:
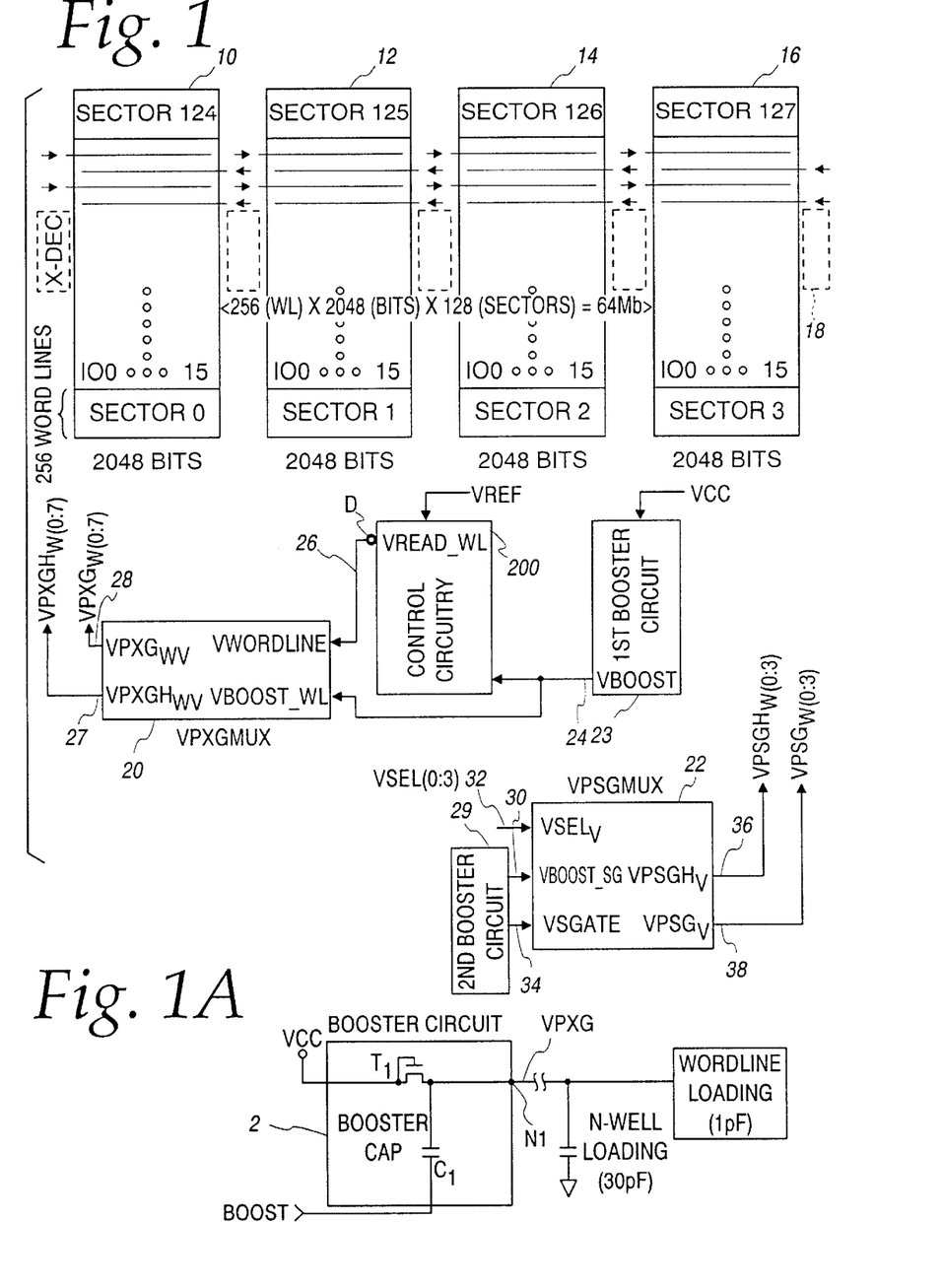
FIG. 1A is a simplified block diagram of a conventional technique for creating a boosted voltage for a wordline.
FIG. 1 is a simplified block diagram of a conventional 64 Mb NOR Flash memory array architecture, utilizing the control circuitry of the present invention.

For example, a 64 Mb (megabit) NOR Flash memory array architecture is illustrated in FIG. 1 which consists of four vertical blocks 10, 12, 14 and 16. Each of the vertical blocks 10–16 is composed of thirty-two sectors. Each of the 128 sectors store 512 Kbits of data arranged in 256 rows of wordlines and 2048 columns of bit lines. A plurality of X-decoders 18 are located between the four vertical blocks 10–16 so as to decode the wordlines in each sector from the left and right sides.

Further, there is often required voltages to be internally generated that are greater than an external or off-chip power supply potential VCC which is supplied to it. For example, it is known that in Flash EEPROMs operating at VCC equal to +3.0 volts, a high voltage of approximately +4.5 volts is needed to be produced for the reading mode of operation of the memory cells. As a consequence, the semiconductor memories also generally include an internal voltage boosting circuit for generating an output signal boosted to be higher than the external supply voltage.

In FIG. 1A, there is shown a simple diagram of a conventional technique for creating a boosted voltage for a wordline. A voltage booster circuit 2 is used for generating a global wordline supply voltage VPXG at node N1, which is passed to appropriate wordlines in the various sectors S0–S127 in the four vertical blocks 10–16 of the memory array via the corresponding X-decoders 18. 5 The global wordline supply voltage VPXG is typically in the range of +4.0 volts to +5.0 volts, which is raised above the input power supply potential VCC of a nominal +3.0 volts. This boosted voltage VPXG is a target voltage which is desired to be maintained at all of the wordlines in the various sectors during a Read mode of operation.

However, since the boosted voltage VPXG applied to the wordline is created by the booster circuit, it will vary greatly with the power supply potential VCC, process corners, and temperature. Thus, the wordline voltage will not be very accurate and will cause errors to occur during the Read operation.

In view of this, there has arisen a need of providing a way of generating an accurate boosted wordline voltage for selected memory core cells during a Read mode of operation on an efficient and effective basis. This is accomplished in the present invention by the provision of control circuitry for generating an accurate boosted wordline voltage for the selected memory core cells during the Read mode of operation.

SUMMARY OF THE INVENTION

Accordingly, it is a general object of the present invention to provide an apparatus and a method for generating an accurate boosted wordline voltage for selected memory core cells during a Read mode of operation which overcomes the problems of the prior art.

It is an object of the present invention to provide an apparatus and a method for generating an accurate boosted wordline voltage for selected memory core cells during a Read mode of operation on an efficient and effective basis.

It is another object of the present invention to provide control circuitry and a method for generating an accurate boosted wordline voltage for selected memory core cells during a Read mode of operation which has low power consumption.

It is still another object of the present invention to provide control circuitry and a method for generating an accurate boosted wordline voltage for selected core memory cells during a Read mode of operation which includes differential amplifier circuitry responsive to a boost signal and a reference voltage for generating a select wordline voltage which is decreased when the wordline voltage is higher than a desired voltage and which is increased when the wordline voltage is lower than the desired voltage.

In accordance with a preferred embodiment of the present invention, there is provided a control circuit for generating an accurate boosted wordline voltage for selected memory core cells in a semiconductor memory device during a Read mode of operation. Memory core transistors are provided which have their conduction paths being coupled between a power supply voltage and a ground potential. Differential amplifier circuitry is responsive to a wordline voltage and a reference voltage so as to generate a select wordline voltage which is decreased when the wordline voltage is higher than a desired voltage and which is increased when the wordline voltage is lower than the desired voltage. The control gates of the memory core transistors are responsive to the select wordline voltage.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Control circuitry and a method for generating an accurate boosted wordline voltage for selected memory core cells during a Read mode of operation are described. In the following description, numerous specific details are set forth, such as specific circuit configurations, components, and the like in order to provide a thorough understanding of the present invention. However, it should be apparent to those skilled in the art that the present invention may be practiced without the specific details. In other instances, well-known processes, circuits, and control lines not particularly relevant to the understanding of the operating principles of the present invention, have been purposely omitted for the sake of clarity.

Referring now in detail to the drawings, there is shown in block diagram form in FIG. 1 a 64 Mb NOR Flash memory architecture which includes four vertical blocks 10, 12, 14 and 16. Each of the blocks 10–16 is comprised of thirty-two sectors. Each of the 128 sectors S0 through S127 stores 512 Kbits of data arranged in 256 rows of wordlines and 2,048 columns of bitlines. Thus, the memory size is 256 (wordline)×2048 (bits)×128 (sectors)=64 Mb.

In order to select one of the four vertical blocks 10–16, they are provided a VPXGMUX selector circuit 20 30 and a VPSGMUX selector circuit 22 (one of each being shown). In practice, there are eight VPXGMUX selector circuits 20 used, one being located on the left and right sides of each vertical block 10–16. Also, there are four VPSGMUX selector circuits 22 used, one being located on the left side of each vertical block 10–16. The selector circuit 20 receives a boosted voltage VBOOST on line 24 from a first booster circuit 23 and a select wordline voltage VREAD_WL on line 26 from the output of a control circuitry 200. The selector circuit 20 is used to pass an N-well signal VPXGH on line 27, which is in the range of +4.5 to +6.2 volts, and is connectable to a wordline N-well region. The VPXGMUX selector circuit 20 also passes a wordline signal VPXG on line 28, which corresponds to the select wordline voltage, and is connectable to a selected wordline. The control circuitry 200 of the present invention is responsive to the boosted voltage VBOOST from the first booster circuit 23 and a reference voltage to generate an accurate boosted wordline voltage on the selected wordline during Read.

Similarly, the VPSGMUX selector circuit 22 receives boosted signal VBOOST_SG on line 30 from a second booster circuit 29, a select signal VSEL on line 32, and a select gate signal VSGATE on line 34 from the second booster circuit. The VPSGMUX selector circuit 22 is used to pass an N-well signal VPSGH on line 36, which is in the range of +4.5 to +6.2 volts and is connectable to a select gate N-well region. The generator circuit 22 also passes a select gate signal VPSG on line 38, which is about +1.5 volts and is connectable to gates of select gate transistors. Further, a plurality of X-decoders 18 are located between the vertical blocks 10–16 and on the outer sides of the blocks 10 and 16 so as to decode each sector from the left and right sides thereof.

As previously pointed out, the boosted voltage VPXG of FIG. 1A applied to the wordline varies greatly with the power supply potential VCC, process corners, and temperature and therefore will not be very accurate. Thus, the purpose of this invention is to provide a control circuitry and method of creating an accurate boosted wordline voltage for the selected memory core cells during a Read mode of operation, but does not consume a large amount of current. In view of this, the inventors of the present invention have developed a way of regulating accurately the boosted wordline voltage of the selected memory core cell by the provision of a control circuitry 200.

Figure 2:
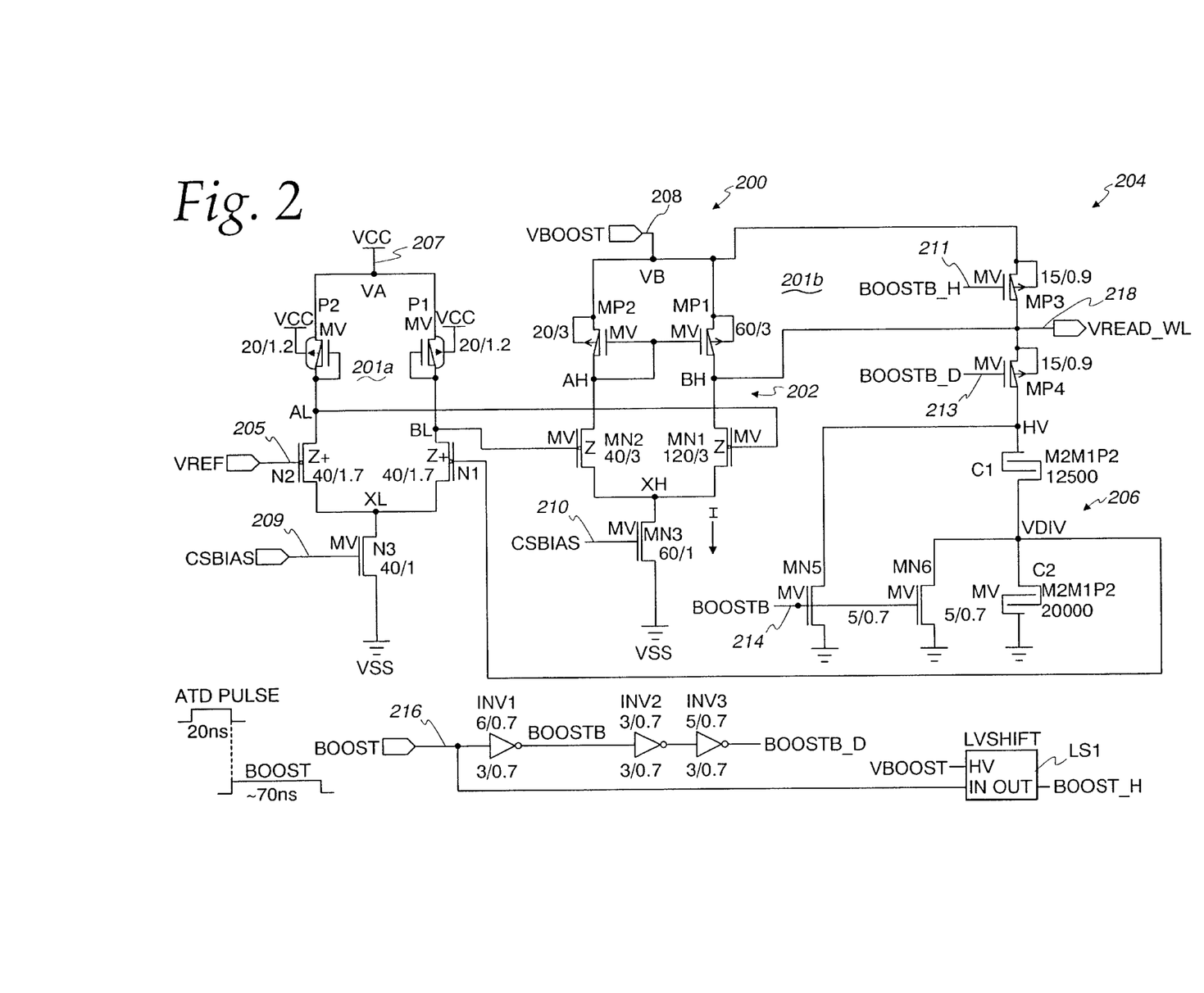
FIG. 2 is a schematic circuit diagram of the control circuitry for use with wordlines and booster circuit in FIG. 1, constructed in accordance with the principles of the present invention.

There is shown in FIG. 2 a detailed schematic circuit diagram of control circuitry 200 of FIG. 1. The control circuitry 200 includes a two-stage amplifier circuit formed of a first differential amplifier stage 201a and a second differential amplifier stage 201b. The second differential amplifier stage 201b includes an unbalanced differential feedback amplifier circuit 202, an output circuit 204, and a capacitor divider circuit 206.

The first differential amplifier stage 201a consists of NMOS input transistors N1, N2; PMOS load transistors P1, P2; and a current source transistor N3. The first input transistor N1 has its gate connected to a node VDIV from the capacitor divider circuit 206, its drain connected to a node BL, and its source connected to the drain of the current source transistor N3 at node XL. The second input transistor N2 has its gate connected to receive a stable reference voltage VREF on line 205, its drain connected to a node AL, and its source connected also to the drain of the current source transistor N3. The reference voltage VREF is generated by a reference generator circuit 700 of FIG. 7 which will be explained hereinbelow and produces a reference voltage of typically +1.3 volts.

The first load transistor P1 has its source connected to a node VA for receiving a power supply potential VCC on line 207 and its drain and gate connected together and to the node BL. The second load transistor P2 has its source connected also to the node VA and its drain and gate connected together and also to the node AL. The power supply potential is in the range of typically +2.6 V to +3.6 V. The current source transistor N3 has its drain connected to the node XL, its source connected to a ground potential VSS (0 volts), and its gate connected to receive a bias voltage CSBIAS on line 209. The bias voltage CSBIAS is generated by a bias generator circuit 600 of FIG. 6, which will be described later and is. in the range of +1.0 V to +1.5 V.

The unbalanced differential feedback amplifier circuit 202 consists of NMOS input transistors MN1, MN2; PMOS load transistors MP1, MP2; and a current source transistor MN3. The first input transistor MN1 has its gate connected to the node AL, its drain connected to the node BH, and its source connected to the drain of the current source transistor MN3 at node XH. The second input transistor MN2 has its gate connected to the node BL, its drain connected to a node AH, and its source connected also to the drain of the current source transistor MN3.

The first load transistor MP1 has its source connected to a node VB for receiving a boosted voltage VBOOST on line 208, its drain connected to the node BH, and its gate connected to the node AH. The second load transistor NP2 has its source connected also to the node VB and its drain and gate connected also to the node AH. The boosted voltage VBOOST is generated by a booster circuit 300 of FIG. 3, which will be explained more fully hereinafter and is in the range of typically +4.4 V to +6.3 V. The current source transistor MN3 has its drain connected to the node XH, its source connected to the ground potential VSS (0 volts), and its gate connected to receive the bias voltage CSBIAS on line 210.

The output circuit 204 includes a pre-charge transistor MP3 and a power-down transistor MP4. The pre-charge transistor MP3 has its source connected to the node VB, its drain connected to the node BH, and its gate connected to receive a boost signal BOOST_H on line 211. The power-down transistor MP4 has its source connected to the node BH, its drain connected to the node HV, and its gate connected to receive a delayed, complement boost signal BOOSTB_D on line 213. The voltage at the node BE defines the accurate boosted wordline voltage VREAD_WL at the node D of FIG. 1 which is provided to the gate of the selected memory core cells.

The capacitor divider network 206 is formed of a first capacitor C1 and a second capacitor C2 connected in series with the first capacitor C1 at the node VDIV. The other end of the first capacitor C1 is connected to the node HV, and the other end of the second capacitor C2 is connected to the ground potential. A first discharge transistor MN5 has its drain connected to the first capacitor C1 at the node HV and its source connected to he ground potential. A second discharge transistor MN6 as its drain connected to the junction of the first and second capacitors at the node VDIV defining a feedback voltage and its source connected to the ground potential. The gates of the first and second discharge transistors MN5, MN6 are connected together and receives the inverted boost signal BOOSTB on line 214.

Figure 4:
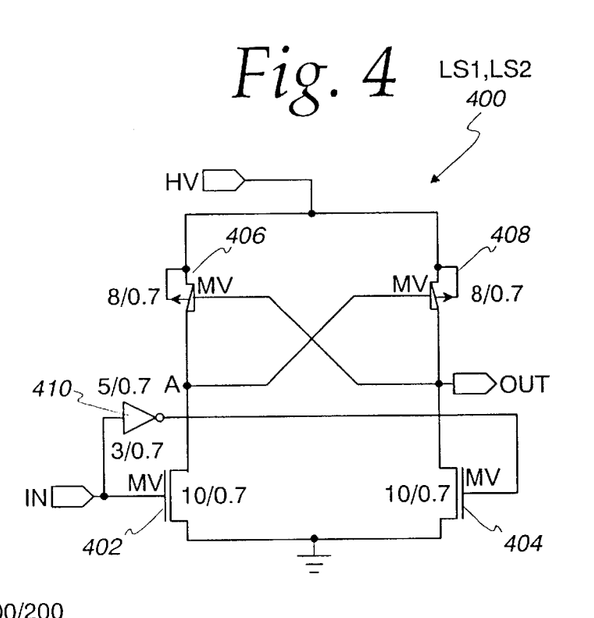
FIG. 4 is a schematic circuit diagram of a level-shifting circuit 400 for use in FIG. 3.

The control circuitry 200 further includes an inverter INV1 which has its input connected to receive a boost signal BOOST on line 216 and its output provides the complement boost signal BOOSTB. An inverter INV2 has its input connected to the output of the inverter INV1 and its output connected to the input of the inverter INV3. The output of the inverter INV3 generates the delayed, complement boost signal BOOSTB_D. A level-shifting circuit LS1 has its input terminal connected to receive also the boost signal BOOST and provides on its output the level-shifted boost signal BOOST_H. A detailed schematic circuit diagram of the level-shifter circuit LS1 is shown in FIG. 4 and will be described more fully hereinbelow. It will be noted that the boost signal BOOST is at a low level during the ATD pulse having a period of 20 nS and is at a high level for about 70 nS beginning on the falling edge of the ATD pulse.

Figure 3:
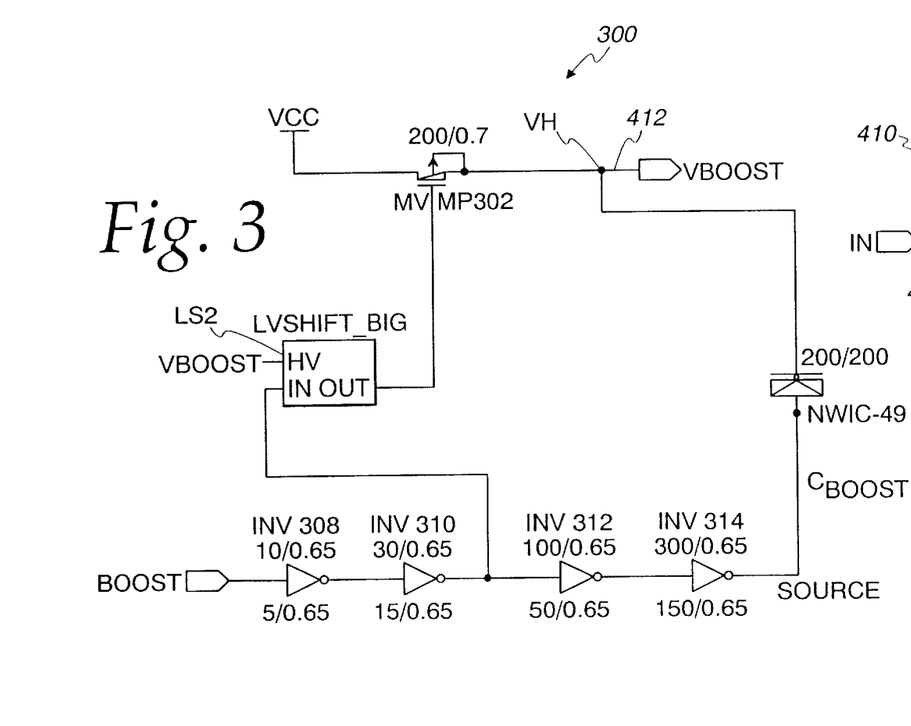
FIG. 3 is a detailed schematic circuit diagram of booster circuit 300 for use in FIG. 2.

Referring now to FIG. 3, there is illustrated a detailed schematic circuit diagram of the booster circuit 300 which generates the boosted voltage VBOOST of +4.4 V to +6.3 V in response to the boost signal BOOST (FIG. 2). The booster circuit 300 includes PMOS transistors MP302; a level-shifter circuit LS2; inverters INV308, INV310, INV312, INV314; and a boost capacitor $C_{boost}$. It will be noted that the level-shifter circuit LS2 is identical to the level-shifter circuit LS1 of FIG. 2. A detailed schematic circuit diagram of a level-shifter 400 for use in FIGS. 2 and 3 is depicted in FIG. 4.

The level-shifter circuit 400 is comprised of a pair of NMOS input transistors 402, 404; a pair of cross-coupled PMOS load transistors 406, 408; and an inverter 410. During the ATD period, the transistor MP302 (FIG. 3) is turned ON since the signal on the output terminal OUT (FIG. 4) will be low. As a result, the voltage on the node VH and the output line 412 will be pre-charged to the power supply voltage vcc between +2.6 V to +3.6 V so as to improve its speed. When the boost signal BOOST goes to a high level, the node VH and the boosted voltage VBOOST on the line 412 will need to be boosted only from the power supply voltage VCC to a higher voltage, thereby improving its speed.

Figure 5A:
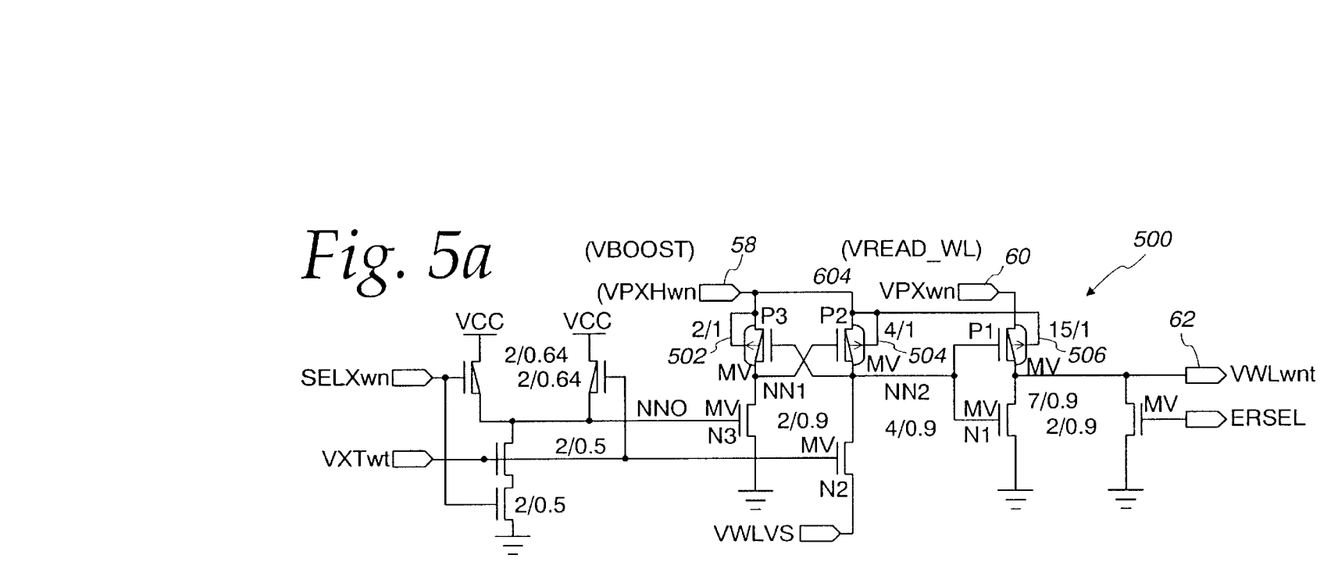
FIG. 5A is a schematic circuit diagram of a vertical wordline decoder 500 for use in FIG. 2.

Referring back to FIG. 2, it should be noted that the boosted voltage VBOOST is connected to parasitic capacitance associated with the N-well loading path in the X-decoder and thus has a heavy capacitive loading (about 30 pF). Therefore, in order to reduce the loading at the node BE so as to decrease the charging time, the wordline voltage VREAD_WL is separated from the boosted voltage VBOOST which reduces the loading at the node BE to about 8 pF. This is accomplished by the vertical wordline decoder 500 of FIG. 5 which is a detailed schematic circuit diagram thereof.

The vertical wordline decoder circuit 500 receives via the VPXGMUX selector circuit 20 (FIG. 1) on line 58 an N-well signal VPXH, which is at the same level as the boosted voltage VBOOST and receives on line 60 a wordline signal VPX, which is at the same level as the select wordline voltage VREAD_WL. The decoder 500 passes a selected vertical wordline voltage VWL on line 62. The decoder 500 includes a pair of cross-coupled P-channel transistors 502, 504 and an output transistor 506. The sources and the N-well regions of the transistors 502, 504 are connected together and to receive the N-well signal VPXH. The gate of the transistor 502 and the drain of the transistor 504 are connected together at a node NN2. The gate of the transistor 504 and the drain of the transistor 502 are connected together at a node NN1. The output transistor 506 has its N-well region connected also to receive the N-well signal VPXH and its source connected to receive the wordline signal VPX. Thus, the signal VPX has been isolated from the signal VPXH since the source and the N-well region of the transistor 506 have been separated from each other and its source is not tied to the signal VPXH. The gate of the transistor 506 is also connected to the node NN2 and the drain thereof is connected to the line 62 for providing the selected vertical wordline voltage VWL. For a detailed discussion of the technique for capacitive loading reduction, reference is made to Ser. No. 09/593,303 filed on Jun. 13, 2000, and entitled "Method to Reduce Capacitive Loading in Flash Memory X-Decoder for Accurate Voltage Control at Wordlines and Select Lines". This application Ser. No. 09/593,303 is assigned to the same assignee as the present invention and is hereby incorporated by reference.

Since it is desired to charge up quickly the voltage VREAD_WL on the output line 218 (FIG. 2) without increasing the bias current for the second differential amplifier stage 201b, the second differential amplifier stage has been purposely designed to be unbalanced so as to provide fast charging time with a low bias current. As can be seen, the size of the transistors MP1, MN1 on the right side is n times larger than the transistors MP2, MN2 on the left side. As a result, there will be created approximately n times the bias current I flowing through the transistor MP1 for charging up the node BH.

Figure 5B:
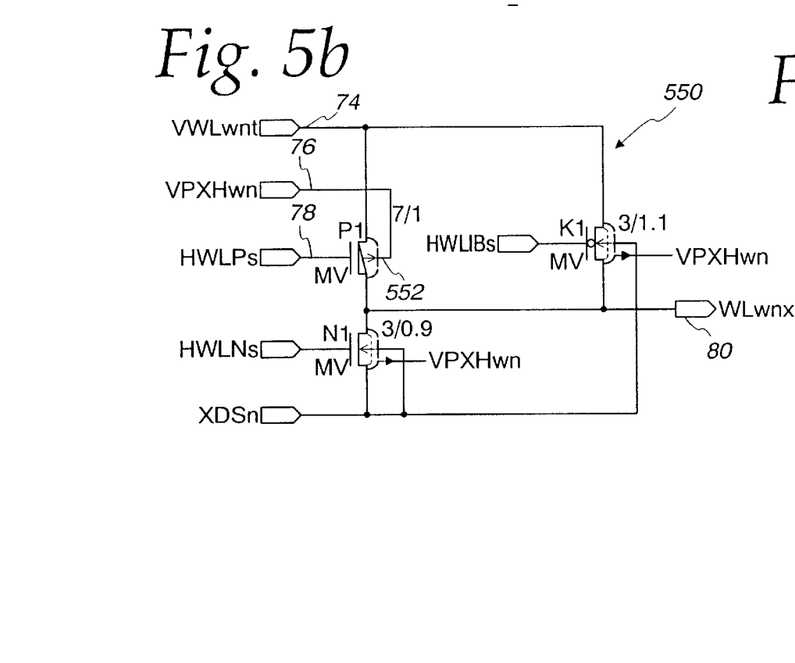
FIG. 5B is a schematic diagram of a wordline driver circuit 550 for use in FIG. 2.

Referring now to FIG. 5B, there is illustrated a schematic circuit diagram of one of the 128 wordline drivers 550. It should be understood that there is a wordline driver for each of the 256 wordlines in a sector. The wordline driver 550 receives on line 74 the selected vertical wordline voltage VWL from the decoder 500, on line 76 the N-well signal VPXH from a VPX generator circuit (not shown), and on line 78 a select horizontal wordline voltage HWLP from a horizontal decoder (not shown). The wordline driver 550 passes the selected wordline voltage WL on line 80. Thus, the vertical wordline voltage VWL has been isolated from the N-well signal VPXH since the source and N-well region of the transistor 552 have been separated from each other and its source is not tied to the VPXH signal. The wordline decoder includes a P-channel transistor 552 having its source connected to receive the vertical wordline voltage VWL, its gate connected to receive the horizontal wordline voltage HWLP, and its drain connected to the line 80 for providing the selected wordline voltage WL. The N-well region of the transistor 552 is connected to receive the N-well region signal VPXH. In operation, when the horizontal wordline voltage on the gate of the transistor 552 is low, the transistor 552 will be turned ON so as to supply the vertical wordline voltage VWL to the line 80.

Figure 6:
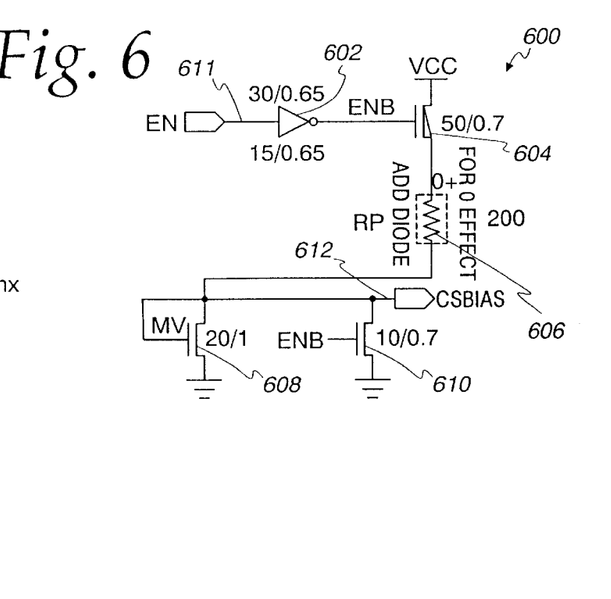
FIG. 6 is a schematic circuit diagram of a bias generator circuit 600 for use in FIG. 2.

With respect to FIG. 6, there is illustrated a schematic circuit diagram of the bias generator 600 for generating the bias voltage CSBIAS which is connected to the gates of the current source transistors N3, MN3 of FIG. 2. The bias generator circuit 600 is formed of an inverter 602, a PMOS transistor 604, a resistor 606, and NMOS transistors 608, 610. When the enable signal EN on line 611 is at a high level, the transistor 604 will be turned ON so as to cause a current to flow through the resistor 606 and the transistor 608. As a result, the bias voltage CBIAS will be generated on line 612 which is approximately 1.0 V to 1.5 V.

Figures 7, 8:
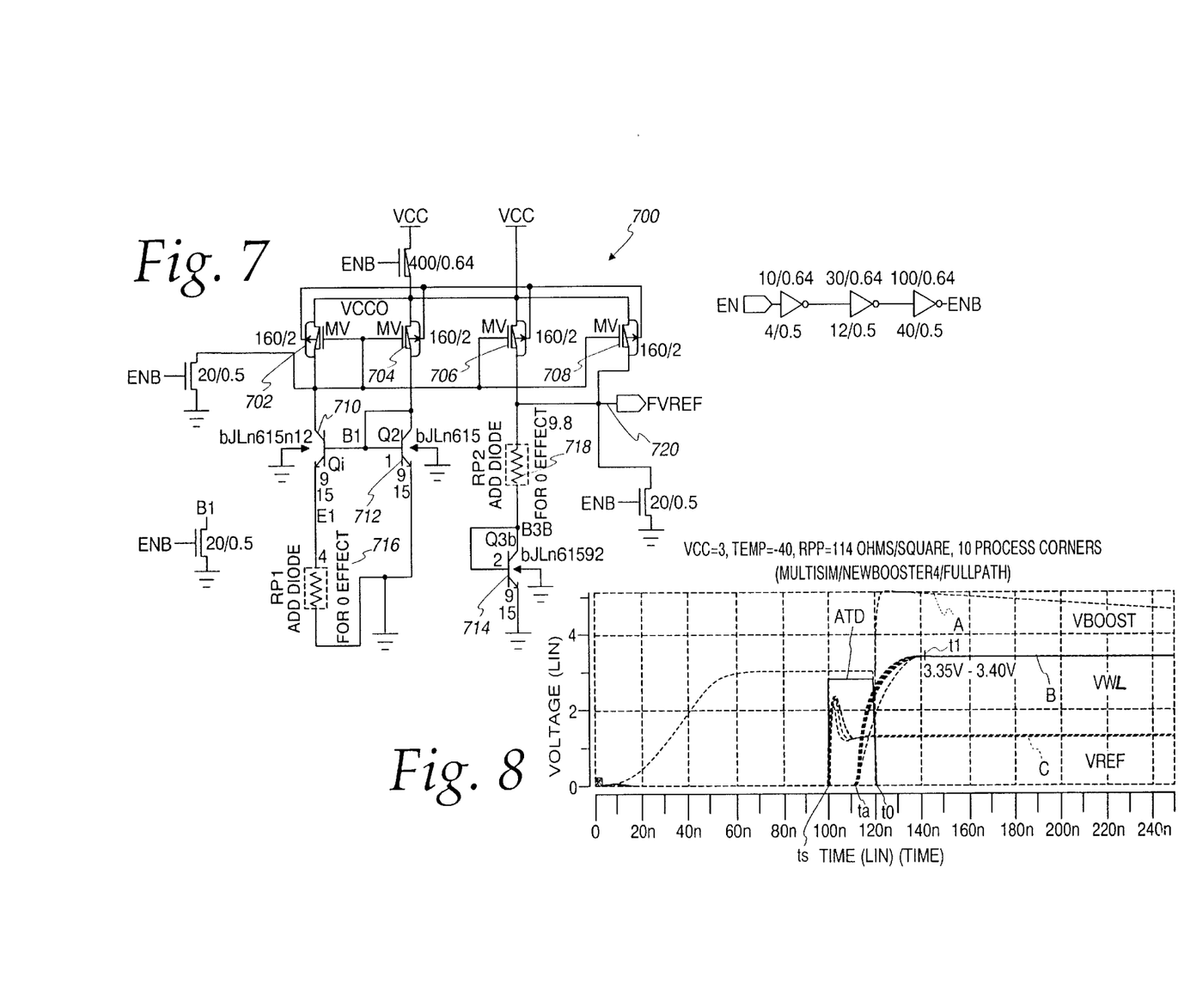
FIG. 7 is a schematic circuit diagram of a reference generator circuit 700 for use in FIG. 2.
FIG. 8 are waveforms at various points in the circuit of FIG. 2, useful in explaining the operation of the present invention.

In FIG. 7, there is shown a detailed schematic circuit diagram of the reference generator circuit 700 for generating the stable reference voltage VREF of +1.3 V which is connected to the gate of the second input transistor N2 on the line 205 (FIG. 2). The reference generator 700 includes PMOS current mirror transistors 702 through 707; bipolar transistors 710, 712, 714 and resistors 716, 718. The current in the bipolar transistors 710, 712 will be reflected to flow through the resistor 718 and the bipolar transistor 714 so as to create the stable reference voltage VREF on line 720. The reference voltage VREF varies about 80 mV.

The operation of the control circuitry 200 of the present invention depicted in FIG. 2 will now be explained with reference to the waveforms in FIG. 8. Initially, it will be noted that the control circuitry 200 is enabled during the ATD pulse period and thus the boosted signal VBOOST (curve A of FIG. 8) is pre-charging towards the power supply voltage VCC (e.g., +3.0 volts) when the ATD pulse ends at time t0.

At the start of the ATD pulse at time ts, the enable signal EN will go high so as to cause the stable reference voltage VREF (curve C) to charge up quickly and is settled to about +1.3 volts after 20 nS. Since the pre-charge transistor MP3 will also be turned ON during the ATD period, the node BH will also have been pre-charged to the power supply voltage VCC. At the end of the ATD pulse or time t0, the boost signal BOOST will go high. Further, the vertical wordline decoder 500 (FIG. 5a) is selected during the ATD pulse period by applying a high logic level to nodes VXT and SELX. As a consequence, the transistor 506 will be turned ON so as to cause the select wordline voltage VWL on the line 62 (curve B) to start going up from the ground potential VSS at time ta until the end of the ATD pulse at the time t0. (The highest voltage that it can reach during the ATD pulse is VCC.) After the ATD pulse period, the voltage VWL will be raised and continue to charge until it reaches the target voltage (i.e., +3.5 V) at time t1 in FIG. 8. The select wordline voltage VREAD_WL at the node BH (FIG. 2) is approximately equal to the selected vertical wordline voltage VWL. The values of the capacitors C1 and C2 are selected so that the feedback voltage at the node VDIV is at +1.3 V (equal to the reference voltage VREF) when the desired voltage at the node BH is reached at the time t1. Thus, the stable reference voltage VREF of +1.3 V is used to define the desired voltage at the node BH. It should be noted that the control circuitry 200 is enabled during the ATD pulse period and the vertical wordline decoder is preferred to be also activated at the beginning of the ATD pulse at the time t0. However, due to inherent delays, the vertical wordline decoder will not be activated until the time ta.

Now, assume that the voltage at the node BH is at +3.7 V (higher than the desired voltage of +3.5 V). This will cause the voltage fed back from the node VDIV to be higher than the reference voltage VREF of +1.3 V and will render the transistor N1 to be more conductive and the voltage at the node BL will go lower so as to cause less conduction in the transistor MN2. Further, the transistor N2 will become less conductive and the voltage at the node AL will go higher so as to cause more conduction in the transistor MN1. This will, in turn, cause the voltage at the node BE to be lowered toward the desired voltage. On the other hand, if the node BE is at +3.3 V, then the opposite will occur in the differential amplifier circuits 201a and 201b so as to raise the voltage towards the desired voltage of +3.5 V. In this manner, it can be seen that the voltage at the node BH is regulated accurately to be at +3.5 V which corresponds to the wordline voltage WL at the gate of the selected memory core cell.

From the foregoing detailed description, it can thus be seen that the present invention provides control circuitry and a method for generating an accurate boosted wordline voltage for selected memory core cells during a Read mode of operation. The control circuitry of the present invention includes first and second differential amplifier stages for generating a select wordline voltage which is applied to control gate of the selected memory core transistors.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A control circuit for generating an accurate boosted wordline voltage for selected memory core cells in a semiconductor memory circuit during a Read mode of operation, said control circuit comprising:

said selected memory core cells being coupled between a power supply voltage and a ground potential;

differential amplifier means responsive to a boost signal and a reference voltage for generating a select wordline voltage which is decreased when the wordline voltage is higher than a desired voltage and which is increased when the wordline voltage is lower than the desired voltage;

said differential amplifier means including a two-stage amplifier circuit formed of a first differential amplifier stage and a second differential amplifier stage;

said first differential amplifier stage including a first input transistor having its gate connected to a stable reference voltage and a second input transistor having its gate coupled to a feedback voltage which is proportional to the select wordline voltage;

said second differential amplifier stage including a third input transistor having its gate connected to the collector of the second input transistor of the first stage and a fourth input transistor having its gate coupled to the collector of the first input transistor of the first stage, the collectors of the third and fourth input transistors being coupled to receive the boost signal, the collector of the fourth input transistor providing the select wordline voltage;

a capacitor divider network including a first capacitor and a second capacitor connected in series between the select wordline voltage and a ground potential, the junction of said first and second capacitors providing the feedback voltage; and the memory core cells being responsive to said select wordline voltage.

2. A control circuit for generating an accurate boosted wordline voltage as claimed in claim 1, further comprising a first constant current source transistor having its drain connected to the sources of said first and second input transistors of the second stage, its source connected to the ground potential, and its gate connected to receive a bias voltage.

3. A control circuit for generating an accurate boosted wordline voltage as claimed in claim 2, further comprising reference voltage generator means for generating the stable reference voltage.

4. A control circuit for generating an accurate boosted wordline voltage as claimed in claim 3, further comprising bias generator means for generating the bias voltage.

5. A control circuit for generating an accurate boosted wordline voltage as claimed in claim 1, wherein the size of the fourth input transistor of the second stage is n times larger than the size of the third input transistor of the second stage so as to create an unbalanced differential amplifier circuit.

6. A control circuit for generating an accurate boosted wordline voltage as claimed in claim 1, wherein said power supply voltage is in the range of +2.6 V to +3.6 V.

7. A control circuit for generating an accurate boosted wordline voltage as claimed in claim 6, wherein the reference voltage is approximately +1.3 V.

8. A control circuit for generating an accurate boosted wordline voltage as claimed in claim 7, wherein the desired voltage is approximately +3.5 V.

9. A control circuit for generating an accurate boosted wordline voltage as claimed in claim 1, wherein the feedback voltage is substantially equal to the reference voltage when the wordline voltage is at the desired voltage.

10. A control circuit for generating an accurate boosted wordline voltage as claimed in claim 1, wherein said desired wordline voltage is in the range of +3.5 V to +4.0 V.

* * * * *

UNITED STATES PATENT AND TRADEMARK OFFICE
CERTIFICATE OF CORRECTION

PATENT NO.   : 6,292,406 B1
DATED        : September 18, 2001
INVENTOR(S)  : Binh Q. Le It is certified that error appears in the above-identified patent and that said Letters Patent is hereby corrected as shown below:

Column 4,
Line 16, delete "30".

Column 5,
Line 30, after "is" delete -- . --.
Line 44, change "NP2" to -- MP2 --.
Line 62, change "BE" to -- BH --.

Column 6,
Line 47, change -- "vcc" to -- VCC --.
Lines 57 and 60, change "BE" to -- BH --.

Column 8,
Line 66, change "BE" to -- BH --.

Column 9,
Line 1, change "BE" to -- BH --.

Signed and Sealed this

Twenty-eighth Day of May, 2002

Attest:

JAMES E. ROGAN
*Attesting Officer*          *Director of the United States Patent and Trademark Office*